(12) United States Patent
Younsi et al.

(10) Patent No.: US 8,143,899 B2
(45) Date of Patent: Mar. 27, 2012

(54) METHOD AND APPARATUS FOR DETECTING PARTIAL DISCHARGES IN ELECTRICAL SYSTEMS

(75) Inventors: Abdelkrim Younsi, Ballston Lake, NY (US); Ronald Irving Longwell, Ballston Lake, NY (US); Sameh Ramadan Salem, Rexford, NY (US); Yingneng Zhou, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 1005 days.

(21) Appl. No.: 12/080,215

(22) Filed: Apr. 1, 2008

(65) Prior Publication Data

US 2009/0248328 A1    Oct. 1, 2009

(51) Int. Cl.
*G01R 31/08*   (2006.01)
(52) U.S. Cl. .................... 324/523; 324/535; 324/536
(58) Field of Classification Search .................. 324/523, 324/535, 536
See application file for complete search history.

(56) References Cited

U.S. PATENT DOCUMENTS

| | | | |
|---|---|---|---|
| 5,256,976 A | 10/1993 | Ishikawa et al. | |
| 5,475,312 A | 12/1995 | Sedding et al. | |
| 5,506,511 A | 4/1996 | Nilsson et al. | |
| 5,680,059 A | 10/1997 | Shiota et al. | |
| 5,828,227 A | 10/1998 | Shiota et al. | |
| 5,982,181 A | 11/1999 | Rokunohe et al. | |
| 6,088,658 A | 7/2000 | Yazici et al. | |
| 6,114,871 A | 9/2000 | Shiota et al. | |
| 6,192,317 B1 * | 2/2001 | Yazici et al. | 702/58 |
| 6,300,768 B1 | 10/2001 | Kato et al. | |
| 6,313,640 B1 | 11/2001 | Nasrallah et al. | |
| 6,424,162 B1 | 7/2002 | Rokunohe et al. | |
| 6,445,189 B1 | 9/2002 | Pakonen et al. | |
| 6,448,782 B1 | 9/2002 | Pakonen et al. | |
| 6,469,515 B2 | 10/2002 | Borsi et al. | |
| 6,483,316 B2 | 11/2002 | Kato et al. | |
| 6,507,181 B1 | 1/2003 | Pakonen et al. | |
| 6,600,108 B1 * | 7/2003 | Mydur et al. | 174/120 R |
| 6,809,523 B1 | 10/2004 | Ahmed et al. | |
| 2002/0163344 A1 | 11/2002 | Rokunohe et al. | |
| 2005/0035768 A1 | 2/2005 | Rabach et al. | |
| 2006/0022679 A1 * | 2/2006 | Obata et al. | 324/551 |
| 2007/0063709 A1 * | 3/2007 | Goodrich et al. | 324/536 |

FOREIGN PATENT DOCUMENTS

WO    WO2007/093861 A2    8/2007

* cited by examiner

*Primary Examiner* — Melissa Koval
*Assistant Examiner* — Farhana Hoque
(74) *Attorney, Agent, or Firm* — Armstrong Teasdale LLP

(57) ABSTRACT

A method of detecting partial discharge associated with at least a portion of an electrical system, wherein the electrical system includes at least one electrical machine electrically coupled within the electrical system, includes generating an electromagnetic field within the electrical machine. The method also includes collecting partial discharge data from at least a portion of the electrical system. The method further includes determining a first partial discharge inception voltage (PDIV) value of at least a portion of partial discharge activity within the electrical system. The method also includes generating at least one trending comparison of the first PDIV value and at least one second PDIV value of at least a portion of partial discharge activity within the electrical system. The method further includes outputting the results.

20 Claims, 6 Drawing Sheets

METHOD AND APPARATUS FOR DETECTING PARTIAL DISCHARGES IN ELECTRICAL SYSTEMS

BACKGROUND OF THE INVENTION

This invention relates generally to electrical system condition assessment analyzers and more particularly, to methods and apparatus for detecting partial discharge (PD) in electrical systems.

Partial discharge events in an electrical system are pulsed releases of energy that propagate out from their site of origin. The propagation occurs according to the structure surrounding the partial discharge events. An internally generated partial discharge pulse appears and propagates at the end regions of an electrical device, such as a high or low voltage bushing and generator end windings, as specific pulse waves in accordance with the surrounding structure, the location of the origin of the pulse, and the pulse characteristics. Although partial discharge analysis has been used for many years on various electrical equipment, at least some data collections and data interpretations are performed substantially manually using labor-intensive techniques.

Specifically, most known methods of determining Partial Discharge Inception Voltage (PDIV), that is, that voltage associated with the electrical equipment of interest wherein partial discharge activity substantially initiates, include installation and removal of measuring equipment during equipment service outages. Also, specifically, most known methods of partial discharge data interpretation typically include using extensive analysis to interpret the data collected in conjunction with, and in reference to, data collected as a function of differing environmental conditions associated with the electrical equipment. Such extensive analysis typically requires obtaining subject matter experts in the form of highly specialized industry professionals which can be time-consuming and expensive. Moreover, such analyses are neither automated nor substantially close to a present time, that is, close to real time and/or an instantaneous time of such PD activity. For example, such analyses may nor occur until days after such PD activity. Similar issues are also associated with most known methods of determining Partial Discharge Extinction Voltage (PDEV), that is, that voltage associated with the electrical equipment of interest wherein partial discharge activity substantially extinguishes.

BRIEF DESCRIPTION OF THE INVENTION

In one aspect, a method of detecting partial discharge associated with at least a portion of an electrical system is provided. The electrical system includes at least one electrical machine electrically coupled within the electrical system. The method includes generating an electromagnetic field within the electrical machine. The method also includes collecting partial discharge data from at least a portion of the electrical system. The method further includes determining a first partial discharge inception voltage (PDIV) value of at least a portion of partial discharge activity within the electrical system. The method also includes generating at least one trending comparison of the first PDIV value and at least one second PDIV value of at least a portion of partial discharge activity within the electrical system. The method further includes outputting the results.

In another aspect, a partial discharge detection system is provided. The system includes at least one output device and at least one processor coupled in electronic data communication with the at least one output device. The at least one processor is programmed with a first algorithm configured to automatically determine a first partial discharge inception voltage (PDIV) value of at least a portion of partial discharge activity within an electrical system. The electrical system includes an electrical machine electrically coupled within the electrical system. The determination is initiated automatically upon at least one of a measured voltage of the at least one electrical machine exceeding a predetermined voltage threshold value and the measured voltage of the at least one electrical machine increasing as a function of time.

In a further aspect, an electrical system is provided. The electrical system includes at least one electrical device electrically coupled within the electrical system. The electrical system also includes at least one measurement device coupled to the at least one electrical device. The electrical system further includes a partial discharge detection system coupled to at least a portion of the electrical system. The partial discharge detection system includes at least one output device and at least one processor coupled in electronic data communication with the at least one output device. The at least one processor is programmed with a first algorithm configured to automatically determine a first partial discharge inception voltage (PDIV) value of at least a portion of partial discharge activity within the electrical system. The determination is initiated automatically upon at least one of a measured voltage of the at least one electrical machine exceeding a predetermined voltage threshold value and the measured voltage of the at least one electrical machine increasing as a function of time.

The method and apparatus described herein for determining a Partial Discharge Inception Voltage (PDIV) and Partial Discharge Extinction Voltage (PDEV) of an electrical system facilitates data collection and interpretation for determining changes in partial discharge activity within such electrical systems. The apparatus is substantially automated and is in service substantially continuously, thereby facilitating real time monitoring, detection and analysis with little to no additional analytical resources.

DETAILED DESCRIPTION OF THE INVENTION

The method and apparatus described herein for determining a Partial Discharge Inception Voltage (PDIV) and Partial Discharge Extinction Voltage (PDEV) of an electrical system facilitates cost-effective and reliable operation of such electrical systems. Specifically, the partial discharge detection system described herein facilitates routine determination of changes in partial discharge activity within such electrical systems. Early detection of changes in partial discharge activity facilitates timely remedial activities and mitigation of a potential for deleterious degradation of such electrical systems. Moreover, the partial discharge detection system described herein facilitates cost-effective monitoring and analysis by mitigating additional hardware and programming resources.

Figure 1:
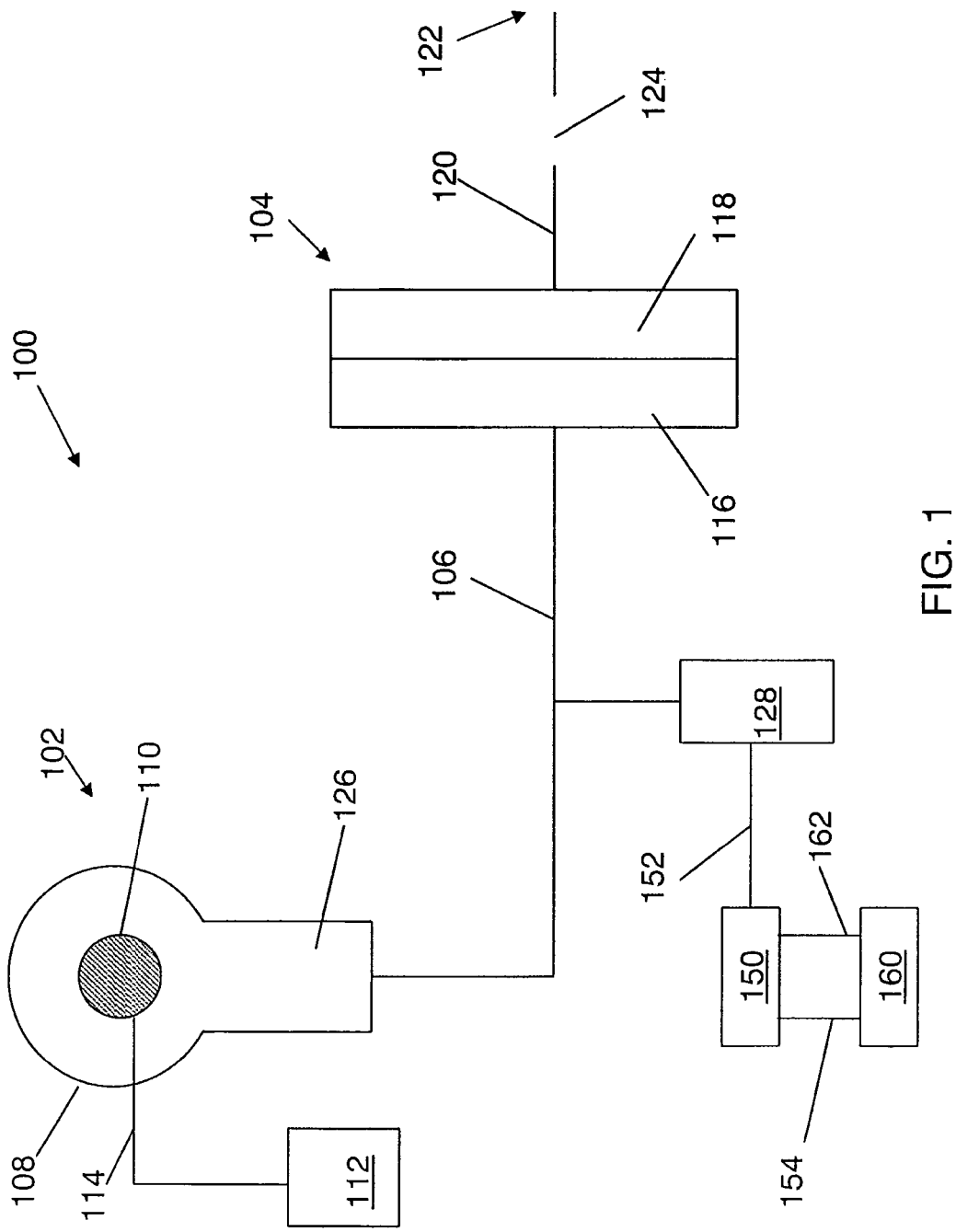
FIG. 1 is a schematic block diagram of an exemplary electrical system.

FIG. 1 is a schematic block diagram of an exemplary electrical system 100. In the exemplary embodiment, system 100 is at least a portion of a typical electric power generation and transmission facility such as a power plant (not shown). Alternatively, system 100 is any system at any facility that facilitates generation and transmission of electric power. System 100 includes an electric power generator 102 that is electrically coupled to a step-up transformer 104 via a plurality of isophase bus ducts 106. Generator 102 includes a stator 108 that extends about a rotor 110. In the exemplary embodiment, generator 102 is a wound rotor, three-phase, electrically excited synchronous generator (EESG). Alternatively, generator 102 is any generator that facilitates operation of system 100 as described herein including, but not limited to, doubly-fed induction (asynchronous) generators (DFIGs), other types of induction (asynchronous) generators (IGs), permanent magnet synchronous generators (PMGs), and switched reluctance (synchronous) generators (SRGs). Also, in the exemplary embodiment, rotor 110 is a wound rotor that is electrically coupled to an excitation system 112 via an electric conduit 114. Alternatively, rotor 110 is any rotor that facilitates operation of generator 102 as described herein, including, but not limited to, a permanent magnet rotor. Rotor 110 is coupled to a drive device (not shown), for example, but not limited to, a steam turbine, wind turbine, or a gas turbine. Transformer 104 includes a primary winding side 116 and a secondary winding side 118.

System 100 also includes a high voltage bus 120 electrically coupled to secondary winding side 118. Bus 120 is electrically coupled to a high voltage switchyard 122 via a circuit breaker 124 (illustrated in the open condition). System 100 further includes a generator lead box 126 that is an enclosure wherein a plurality of generator stator winding terminals (not shown) are electrically coupled to isophase bus ducts 106. System 100 also includes a neutral ground cubicle 128 that is electrically coupled to isophase bus ducts 106 and is configured to house a variety of grounding devices as well as system protection and measurement instrumentation (neither shown). Electrical system 100 further includes a partial discharge (PD) detection system 150. In the exemplary embodiment, system 150 is electrically coupled to a portion of cubicle 128 via a PD detection system input conduit 152. Alternatively, system 150 is electrically coupled to any portion of system 100 that facilitates operation of system 150 as described herein including, but not limited to, lead box 126. System 150 is also coupled in electronic data communication with a data acquisition system (DAS) 160 via a PD detection system output conduit 154 and a DAS output conduit 162.

In operation, system 100 facilitates generation and short-distance transmission of electric power. Specifically, rotor 110 is energized via excitation system 112 to generate a rotating electromagnetic field (not shown) that induces a voltage, and subsequently, electric power generation in stator 108. Electric power is transmitted to primary winding side 116 of step-up transformer 104 via lead box 126 and isophase bus ducts 106. Primary side 116 facilitates stepping up a voltage of the generated electric power via inducing an increased voltage in secondary winding side 118. Secondary winding side 118 facilitates transmission of electric power from system 100 to switchyard 122 via bus 120 and breaker 124.

Also, specifically, in operation, during startup activities, rotor 110 is typically rotating at substantially rated synchronous speed, such speeds typically being in the range of approximately 400 revolutions per minute (rpm) up to approximately 20,000 rpm. The field associated with rotor 110 and excitation system 112 is "flashed" and a rotating electromagnetic field begins to build up. As an excitation electrical current increases within conduit 114 and the field strength increases, generator stator voltage at the terminations in lead box 112 increases from substantially 0 volts to substantially full rated line voltage. Generally, the time span between first flashing of the field to substantially attaining rated voltage is approximately 15 seconds up to 60 seconds. Similarly, during shutdown operations of system 100, excitation system 112 is removed from service, excitation current within conduit 114 rapidly decreases, the electromagnetic field within generator 102 collapses, and the generated voltage as measured in lead box 112 collapses from approximately rated voltage to approximately 0 volts in a time span range of 1 to 60 seconds, with typical values of approximately 1 to 2 seconds.

Figure 2:
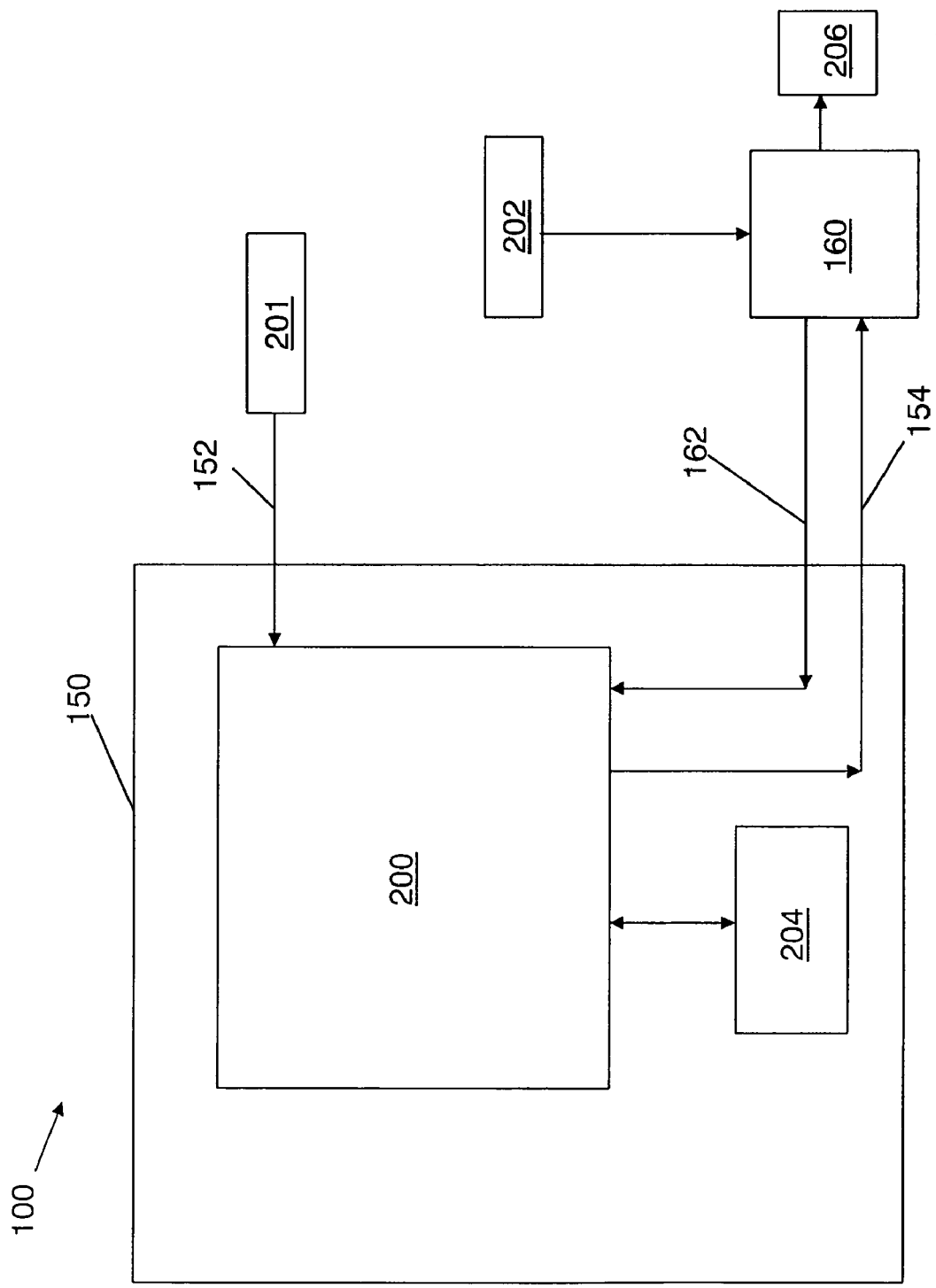
FIG. 2 is a schematic block diagram of an exemplary partial discharge detection system that may be used with the electrical system shown in FIG. 1.

FIG. 2 is a schematic block diagram of exemplary partial discharge detection system 150 that may be used with electrical system 100. System 150 is at least partially coupled in electronic data communication with a portion of system 100 via DAS 160 and conduits 154 and 162. System 150 is programmed to detect partial discharge events activity within a portion of system 100, as well as collect, analyze, and store data about such partial discharge activity. Specifically, system 150 is programmed to determine a voltage generated by generator 102 wherein measurable partial discharge activity substantially initiates. This voltage is referred to as a Partial Discharge Inception Voltage (PDIV). System 150 is also programmed to determine a voltage generated by generator 102 (shown in FIG. 1) wherein measurable partial discharge activity substantially extinguishes. This voltage is referred to as a Partial Discharge Extinction Voltage (PDEV).

In the exemplary embodiment, system 150 is implemented in a single processor 200. Alternatively, system 150 is implemented in a plurality of distributed processors. Also, in the exemplary embodiment, system 150 and DAS 160 are dedicated, stand-alone systems. Alternatively, system 150 is integrated within a larger, more complex, partial discharge analysis system (not shown). Also, alternatively, system 150 and DAS 160 are implemented integrally with and/or within control system architectures that include, but are not limited to, power plant distributed control systems (DCS).

System 150 is further coupled in electronic data communication with a portion of system 100 via a plurality of standard PD detectors 201 and conduit 152, wherein detectors 201 are at least partially positioned within cubicle 128 (shown in FIG. 1). Therefore, in the exemplary embodiment, processor 200 receives data via standard PD detectors 201 via data conduit 152. Moreover, in the exemplary embodiment, system 150 transmits data via cable-type conduits, that include, but are not limited to, Cat 5e and coaxial cables. Alternatively, system 150 receives and transmits signals via any communications technology that facilitates operation of system 150 as described herein, including, but not limited to, RF transmitters and receivers. Also, in the exemplary embodiment, all electrically connected components within system 100 from stator 108 to open circuit breaker 128 are monitored for PD activity, including, but not limited to, cable, duct, and bus insulation, and high voltage and low voltage bushings (not shown) associated with transformer 104 (all shown in FIG. 1).

Moreover, in the exemplary embodiment, DAS 160 is coupled in electronic data communication with a plurality of sensors 202 that include, but are not limited to, system 100 voltage transducers (not shown) that facilitate substantially accurate voltage indications of generator line-to-neutral voltage. Such voltage indications are transmitted as generator voltage signals (not shown) from DAS 160 to processor 200 via conduit 162. Also, in the exemplary embodiment, sensors 202 include, but are not limited to, stator winding temperatures, a status of excitation system 112, a status of breaker 124, hydrogen pressure, megawatts (MW), and megavolts-amperes reactive (MVAR). Alternatively, sensors 202 are directly coupled in electronic data communication with processor 200 such that generator voltage signals, stator winding temperatures, hydrogen pressure, MW, MVAR, and breaker 124 status and system 112 status are transmitted directly to processor 200.

Processor 200 is configured to receive from partial discharge sensors 201, and time stamp, partial discharge pulse data generated by PD events. Processor 200 is also configured to receive, and time stamp, stator winding temperature signals, hydrogen pressure, MW, MVAR, and generator line-to-neutral voltage signals via sensors 202, DAS 160, and conduit 162.

System 150 also includes a data storage module 204 coupled in electronic data communication with processor 200. Data storage module 204 is configured to store data that includes, but is not limited to, PD activity data, generator line-to-neutral voltage data, hydrogen pressure, MW, MVAR, and stator winding temperature data, wherein all of the data is time stamped. System 150 further includes an output device 206 coupled in electronic data communication with DAS 160. Output device 206 is configured to display PD versus voltage analysis results transmitted from processor 200 that includes, but is not limited to, tabular results, graphical results, trends, operator warnings and any other data from any other operable database.

System 150 is substantially automatic. Specifically, with respect to partial discharge detection, while system 150 is in service, system 150 is ready to make a PDIV determination upon startup of generator 102.

Figure 3:
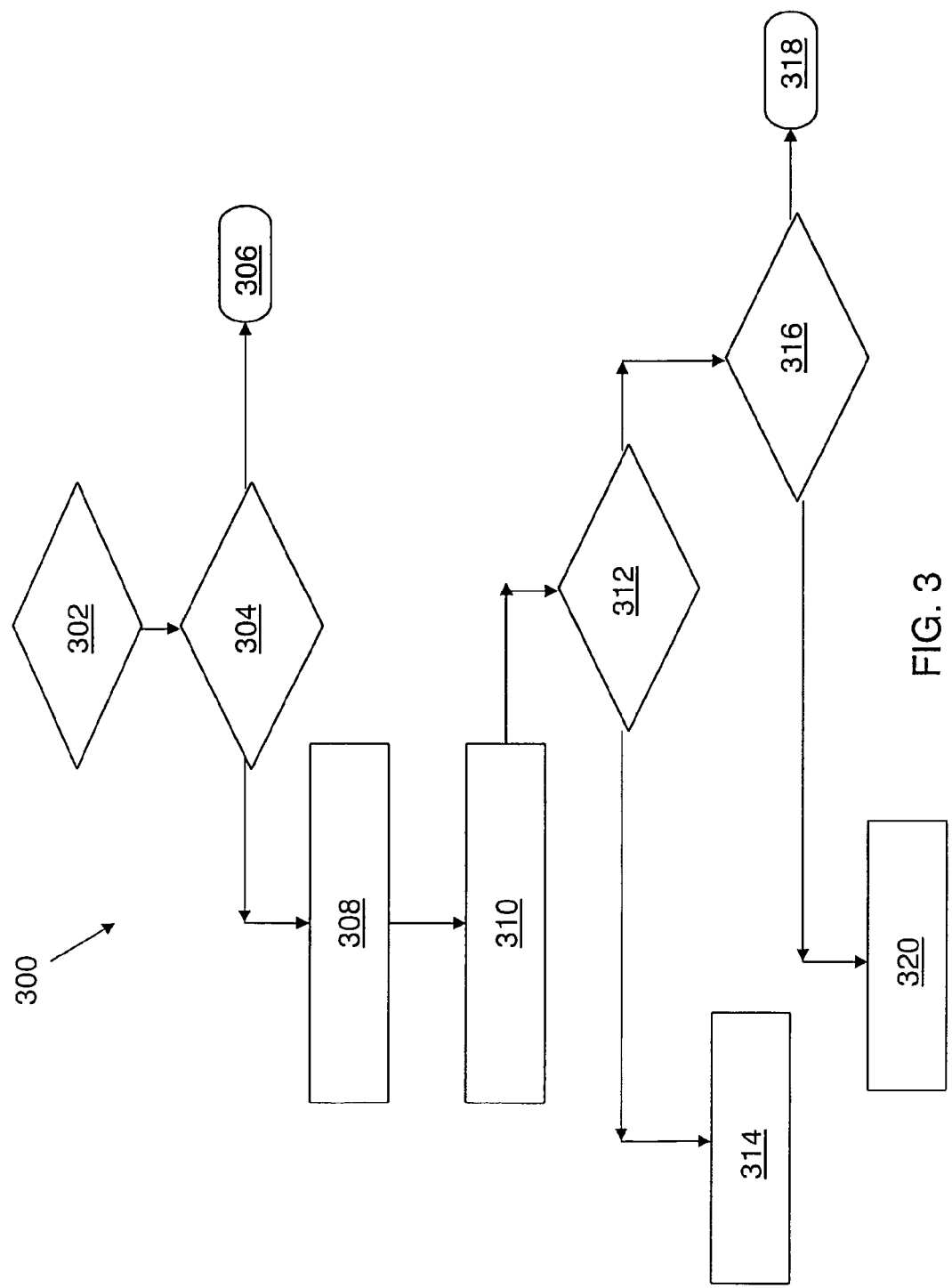
FIG. 3 is a flow chart illustrating an exemplary method of determining partial discharge inception voltage using the partial discharge detection system shown in FIG. 2.

FIG. 3 is a flow chart 300 illustrating an exemplary method of determining partial discharge inception voltage using partial discharge detection system 150 (shown in FIGS. 1 and 2). Processor 200 is programmed with a sufficient plurality of algorithms as well as sufficient programmed logic, discrete and analog, to facilitate operation of system 150 as described herein. Flow chart 300 illustrates a portion of such logic that is programmed to determine a PDIV during a cold startup of generator 102 and at least a portion of system 100 (both shown in FIG. 1). Specifically, processor 200 and flow chart 300 include a first discrete functional logic block 302. Functional logic block 302 facilitates determining if generator 102 is in a cold start-up condition and transmits a discrete "true" or "false" signal (neither shown) as a function of measured generator line-to-neutral voltage.

More specifically, in the exemplary embodiment, when generator line-to-neutral voltage is less than approximately 100 volts alternating current (AC) (root mean squared (RMS)), or 100 $V_{RMS}$, a first requirement to initiate the method associated with flow chart 300 is met and a discrete "true" signal is transmitted from functional logic block 302. In the event that measured generator line-to-neutral voltage exceeds 100 $V_{RMS}$, a "false" signal is transmitted from functional logic block 302. Alternatively, any values of generator line-to-neutral voltage are used. Further, alternatively, discrete logic inputs that indicate that generator 102 has attained cold startup conditions that include, but are not limited to, generator winding temperature measurements, excitation system 112 removed from service, and circuit breaker 124 in the open position, may be used instead of, or in addition to, the voltage requirement. The technical effect is that system 150 makes a determination whether generator 102 is in a cold start-up condition Flow chart 300 also includes a second discrete functional logic block 304 that is coupled in electronic data communication with first discrete functional logic block 302. Specifically, in the exemplary embodiment, when generator line-to-neutral voltage is less than 100 $V_{RMS}$, a discrete "true" signal is transmitted from functional logic block 302 to functional logic block 304. The technical effect is that the functionality of block 304 (described further below) is initiated upon successful receipt of the discrete "true" signal from block 302. Such functionality, if not already initiated, remains dormant upon receipt of discrete "false" signals from block 302. The technical effect is that system 150 does not initiate PD measurements and analyses while such measurements and analyses are already in progress or generator 102 is not in a cold start-up condition.

Functional logic block 304 is programmed to determine two conditions. Specifically, block 304 determines if a measured value of generator line-to-neutral voltage is less than 90% to 110% of rated generator line-to-neutral voltage and a change in generator line-to-neutral voltage with respect to time, that is, dV/dt, is positive and exceeds a predetermined positive value. If these two requirements to initiate the determination of PDIV at cold startup are met, a discrete "true" signal is generated and transmitted by block 304. If either of these two discrete requirements are not met, a discrete "false" signal is generated and transmitted by block 304. Alternatively, discrete logic inputs that indicate that generator 102 is in a cold startup condition that include, but are not limited to, generator winding temperature measurements and excitation system 112 placed in service, may be used instead of, or in addition to, the two voltage requirements. Also, alternatively, any values of generator line-to-neutral voltage are used.

Flow chart 300 further includes a discrete "end" functional logic block 306 that is coupled in electronic data communication with logic block 304. If either one of the two discrete conditions that include the measured generator line-to-neutral voltage being less than 90% to 110% of rated generator line-to-neutral voltage and dV/dt being positive and/or greater than a predetermined positive value is not met, a discrete "false" signal (not shown) is transmitted to logic block 306 and operation of the associated features illustrated in flow chart 300 are terminated via logic block 306. The technical effect is for system 150 to not perform PD measurements and analyses for a predetermined period of time and/or until both discrete conditions are met, that is, that is, to shift to a "standby" status while generator 102 is not in a cold start-up condition.

Flow chart 300 also includes a PDIV determination function block 308 that is coupled in electronic data communication with second discrete functional logic block 304. If both of the two discrete conditions that include the measured generator line-to-neutral voltage being less than 90% to 110% of rated generator line-to-neutral voltage and dV/dt being positive and less than a predetermined value are met, a discrete "true" signal (not shown) is generated and transmitted to function block 308. Function block 308 is programmed to receive data transmitted from sensors 201 via conduit 152 as well as data transmitted from sensors 202 via DAS 160 and conduit 162 upon successful receipt of such "true" signal. All data received and determined by function block 308 is time stamped.

Moreover, function block 308 includes at least one algorithm programmed to determine a PDIV associated with a partial discharge level quantity ($Q_{PD}$), wherein $Q_{PD}$ is generated via a combination of measurements and determinations associated with partial discharge activity. A variety of statistical analyses are available for evaluating measured partial discharge data and a finite number of such analyses are selected for the exemplary partial discharge data. For example, a normalized quantity number (NQN), wherein the NQN (in units of millivolts (mV)) is generated via a combination of measurements and determinations associated with partial discharge activity. Another such analysis includes, but is not limited to, determinations of values for maximum partial discharge charge ($Q_{max}$) in units of mV, wherein $Q_{max}$ is defined as the pulse magnitude equivalent to 10 pulses per second (pps). Alternatively, any parameter and any statistical analysis that facilitates operation of system 100 as described herein is used. Therefore, depending on the analysis selected, $Q_{PD}$ may have any units that facilitate operation of system 100 as described herein, including, but not limited to, milliamperes (mA), picoCoulombs (pC) and mV.

Figure 4:
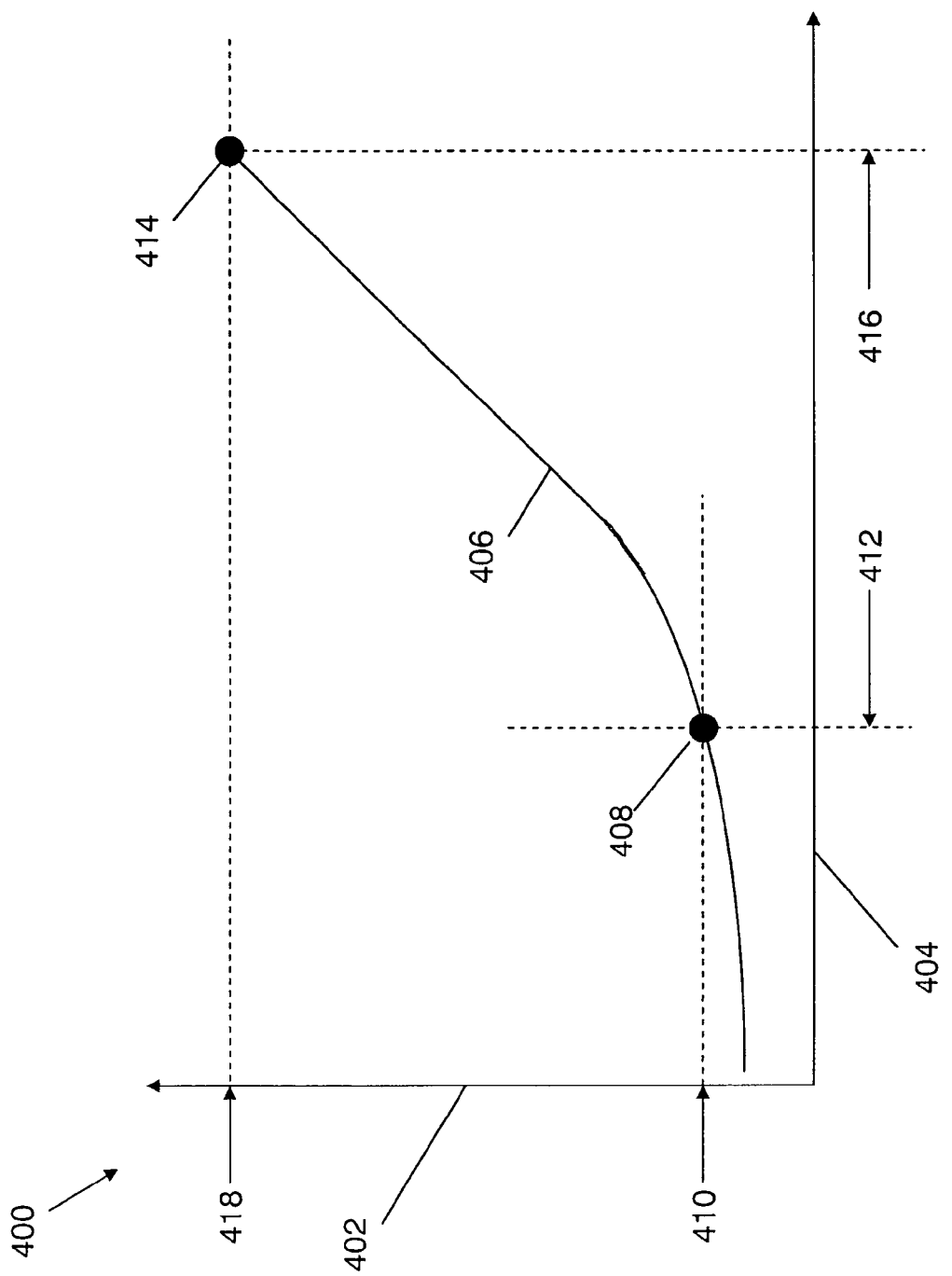
FIG. 4 is a graph of a partial discharge level vs. a generator line-to-neutral voltage generated by using the method shown in FIG. 3.

FIG. 4 is a graph 400 of a partial discharge level quantity ($Q_{PD}$) vs. a generator line-to-neutral voltage using the method illustrated in flow chart 300 (shown in FIG. 3). Specifically, graph 400 represents at least a portion of PD data taken during a cold startup of generator 102 (shown in FIG. 1) as a function of generator line-to-neutral voltage. Graph 400 includes an ordinate (y-axis) 402 substantially representative of $Q_{PD}$ in predetermined units and an abscissa (x-axis) 404 substantially representative of generator line-to-neutral voltage graduated in units of $V_{RMS}$. A plurality of $Q_{PD}$ data points measured during a cold startup of generator 102 are plotted on graph 400 wherein a "best fit" $Q_{PD}$ versus voltage trace 406 is generated. In the exemplary embodiment, trace 406 is a substantially continuous trace of a predetermined number of data points having a predetermined spacing between such data points, wherein such spacing is substantially dependent upon features that include, but are not limited to, a scan rate of system 150 or any associated data system.

An exemplary method of detecting partial discharge associated with at least a portion of electrical system 100 (shown in FIG. 1), wherein electrical system 100 includes at least one electrical machine, that is, generator 102 (shown in FIG. 1) electrically coupled within electrical system 100 includes generating an electromagnetic field within generator 102. The method also includes collecting partial discharge data from at least a portion of electrical system 100. The method further includes determining a first PDIV value 412 of at least a portion of partial discharge activity within electrical system 100. The method also includes generating at least one trending comparison of first PDIV value 412 and at least one second PDIV value (not shown) of at least a portion of partial discharge activity within electrical system 100. The method further includes outputting the results to output device 206 (shown in FIG. 2).

Graph 400 also includes a PDIV point 408 that substantially defines the generator line-to-neutral voltage wherein the partial discharge activity rises to a level that corresponds to a level above known statistical noise levels. Specifically, point 408 is at least partially defined by an initial $Q_{PD}$ value, or $Q_{PD0}$ 410 that is programmed within processor 200. Therefore, point 408 identifies a particular measured generator line-to-neutral voltage, or PDIV 412, that corresponds to the portion of trace 406 that crosses and exceeds predetermined $Q_{PD0}$ 410. Graph 400 further includes a generator line-to-neutral voltage point 414 that is at least partially defined by a predetermined generator line-to-neutral voltage 416. A $Q_{PD\ Line}$ value 418 may be determined from point 414. Alternative embodiments of function block 308 include programming to determine and graph partial discharge activity as a function of any parameter, including, but not limited to, stator winding temperature.

Referring again to FIG. 3, flow chart also includes a data storage function block 310 that is coupled in electronic data communication with PDIV determination function block 308. Function block 310 is programmed to receive data transmitted from sensors 201 via conduit 152, data transmitted from sensors 202 via DAS 160 and conduit 162, as well as graph 400 data (including measured PDIV) from function block 308. Moreover, function block 310 is programmed to transmit and store such data in data storage module 204 (shown in FIG. 2).

Flow chart 300 further includes a third discrete functional logic block 312 that is coupled in electronic data communication with data storage function block 310. In the exemplary embodiment, functional logic block 312 is programmed with at least one divisor algorithm (not shown) that divides a signal substantially representative of PDIV 412 by a signal substantially representative of the predetermined generator line-to-neutral voltage 416 (both shown in FIG. 4) and generate an analog dividend signal (not shown). Also, in the exemplary embodiment, functional logic block 312 includes at least one comparative algorithm that is programmed to discretely compare the analog dividend signal with at least one predetermined value.

Specifically, functional logic block 312 is programmed to make a determination if the most recent partial discharge inception voltage is below a predetermined percent of rated line-to-neutral voltage. In general, higher values of PDIV indicate a more robust condition associated with system 100 with respect to partial discharge mitigation. In contrast, lower values of PDIV indicate potential deterioration of system 100 with respect to partial discharge mitigation. Therefore, in the exemplary embodiment, a plurality of PDIV/generator line-to-neutral voltage ratios are programmed within functional logic block 312. Specifically, such ratio values include 5% (corresponding to a PDIV detection threshold) and 10% (corresponding to a deteriorated insulation). Also, specifically, such ratio values include 25%, above which the associated insulation may be considered to be in a non-deteriorated condition and below which the insulation may be considered to be in a deteriorating condition. Further, specifically, such ratio values include 50%, above which the associated insulation may be considered to be in a good condition. Alternatively, any PDIV/generator line-to-neutral voltage ratios that facilitate operation of system 150 as described herein are used.

Functional logic block 312 is further programmed to generate and transmit a discrete "true" signal (not shown) to a low PDIV notification function block 314 that is coupled in electronic data communication with functional logic block 312 in the event that the most recent PDIV/generator line-to-neutral voltage ratio is below a predetermined threshold value. Notification function block 314 is programmed to transmit an operator notification signal (not shown) to output device 206 (shown in FIG. 2). Such notification may be facilitated by methods that include, but are not limited to, initiating pop-up alarms on operator consoles, energizing audible control room alarms, and energizing annunciator windows.

Moreover, functional logic block 312 is programmed to generate and transmit a discrete "false" signal (not shown) to a fourth discrete functional logic block 316 coupled in electronic data communication with functional logic block 312 in the event that the most recent PDIV/generator line-to-neutral voltage ratio is above a predetermined threshold value. In the exemplary embodiment, functional logic block 316 is programmed to make a determination if the most recently determined value of PDIV is less than half of any PDIV value determined within the previous 365 days. Alternatively, any determined value or measured parameter is compared to historical data of any vintage that facilitates operation of system 150 as described herein.

In the event that the most recent PDIV value has not changed by the predetermined value in the predetermined time frame, functional logic block 316 is configured to generate and transmit a discrete "false" signal (not shown) to a discrete "end" functional logic block 318 that is coupled in electronic data communication with logic block 316. Logic block 318 is substantially similar to logic block 306.

Functional logic block 316 is further programmed to generate and transmit a discrete "true" signal (not shown) to a PDIV trend notification function block 320 that is coupled in electronic data communication with functional logic block 316 in the event that the most recent PDIV value has changed by at least the predetermined value in the predetermined time frame. Notification function block 320 is programmed to transmit an operator notification signal (not shown) to output device 206 (shown in FIG. 2). Such notification may be facilitated by methods that include, but are not limited to, initiating pop-up alarms on operator consoles, energizing audible control room alarms, and energizing annunciator windows.

Partial discharge extinction voltage (PDEV) is defined as the highest possible voltage at which partial discharge activity (PD) decreases below a measurable level (such level at least partially defined by the environment noise level and sensitivity of the measurement instruments) as generator voltage decreases gradually from the rated generator line-to-neutral voltage to zero volts. A PDEV for a given electrical system or machine is generally lower than an associated PDIV for the same system or machine. One reason for this phenomena is once corona, or partial discharge activity, is established the ionization events within insulation defects become self-sustained. This ionization activity can self-sustain at a lower voltage level than PDIV as excited species, electrons and photons are produced in sufficient quantity and density to facilitate successful electron avalanches and therefore a continuous PD activity. Generally, it is observed that as the insulation system and its components "age" the PDEV level can become higher. Trending and comparison of PDEV values to PDIV values of a system or machine may facilitate determining indications of insulation aging effects.

As described above, system 150 is substantially automatic. Specifically, with respect to partial discharge detection, while system 150 is in service, system 150 is ready to make a PDEV determination upon shutdown of generator 102.

Figure 5:
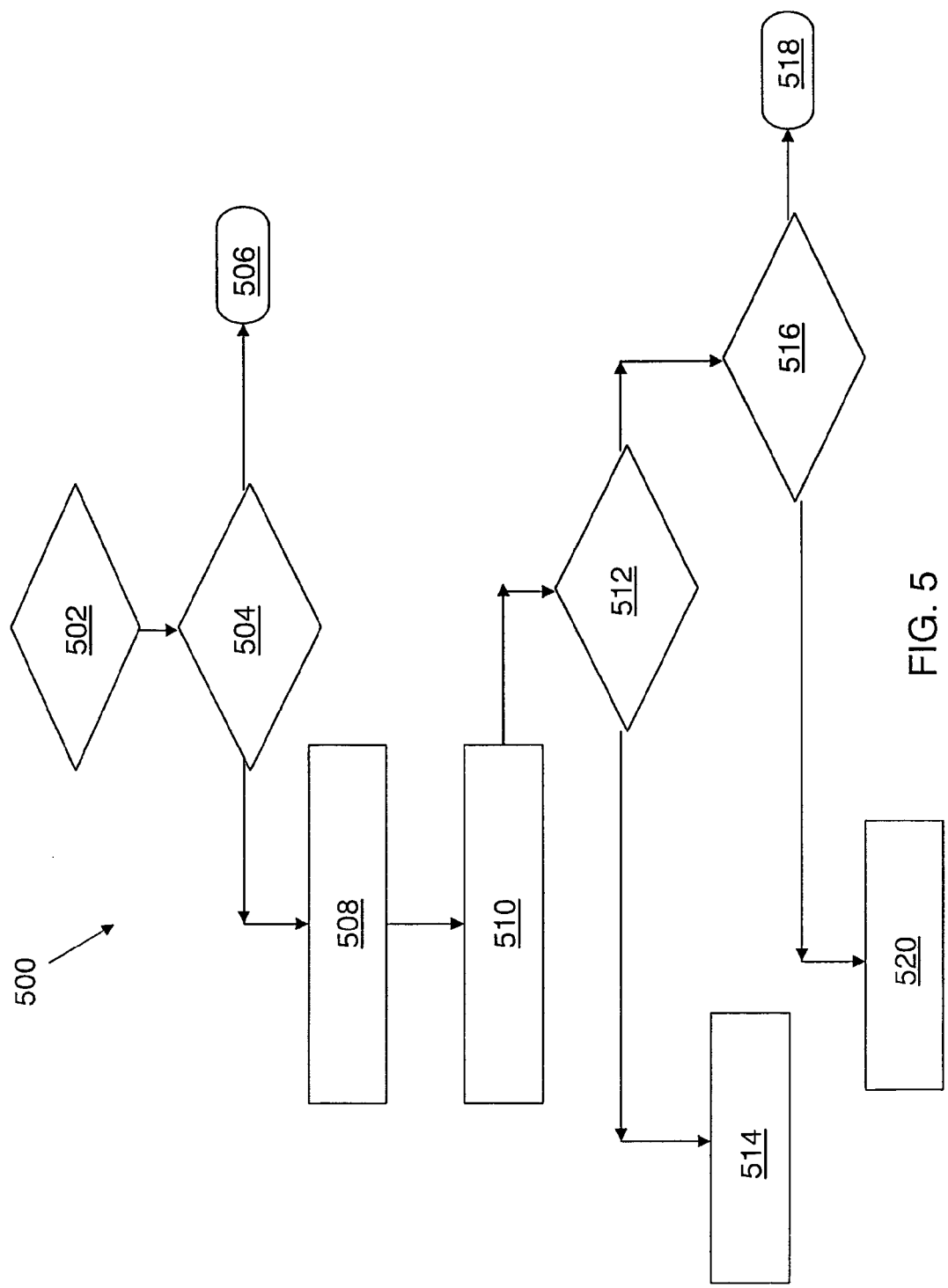
FIG. 5 is a flow chart illustrating an exemplary method of determining partial discharge extinction voltage using the partial discharge detection system shown in FIG. 2.

FIG. 5 is a flow chart 500 illustrating an exemplary method of determining partial discharge extinction voltage using partial discharge detection system 150 (shown in FIGS. 1 and 2). In the exemplary embodiment, processor 200 is further programmed to determine a Partial Discharge Extinction Voltage (PDEV) value in parallel with an electromagnetic field collapse in a manner similar to that used to determine PDIV in parallel with an electromagnetic field buildup as described above. Therefore, processor 200 is programmed with a sufficient plurality of algorithms as well as sufficient programmed logic, discrete and analog, to facilitate operation of system 150 as described herein. Flow chart 500 illustrates a portion of such logic that is programmed to determine a PDEV value during a removal from service, or shutdown, of generator 102 and at least a portion of system 100 (both shown in FIG. 1). Specifically, processor 200 and flow chart 500 include a first discrete functional logic block 502. Functional logic block 502 facilitates determining if generator 102 is being removed from service and/or shutdown and transmits a discrete "true" or "false" signal (neither shown) as a function of measured generator line-to-neutral voltage.

More specifically, in the exemplary embodiment, when generator line-to-neutral voltage is less than approximately 95% of rated generator line-to-neutral voltage, a first requirement to initiate the method associated with flow chart 500 is met and a discrete "true" signal is transmitted from functional logic block 502. When the measured generator line-to-neutral voltage exceeds 95% of rated generator line-to-neutral voltage, a "false" signal is transmitted from functional logic block 502. Alternatively, any values of generator line-to-neutral voltage are used. Further, alternatively, discrete logic inputs that indicate that generator 102 is being removed from service include, but are not limited to, excitation system 112 removed from service, and circuit breaker 124 in the open position, may be used instead of, or in addition to, the voltage requirement. The technical effect is that system 150 makes a determination whether generator 102 is being removed from service.

Flow chart 500 also includes a second discrete functional logic block 504 that is coupled in electronic data communication with first discrete functional logic block 502. Specifically, in the exemplary embodiment, when generator line-to-neutral voltage is less than approximately 95% of rated generator line-to-neutral voltage, a discrete "true" signal is transmitted from functional logic block 502 to functional logic block 504. The technical effect is that the functionality of block 504 (described further below) is initiated upon successful receipt of the discrete "true" signal from block 502. Such functionality, if not already initiated, remains dormant upon receipt of discrete "false" signals from block 502. The technical effect is that system 150 does not initiate PD measurements and analyses while such measurements and analyses are already in progress or generator 102 is not being removed from service.

Functional logic block 504 is programmed to determine two conditions. Specifically, block 504 determines if a measured value of generator line-to-neutral voltage is less than 95% of rated generator line-to-neutral voltage and a change in generator line-to-neutral voltage with respect to time, that is, dV/dt, is negative and exceeds a predetermined negative value. If these two requirements to initiate the determination of PDEV at shutdown are met, a discrete "true" signal is generated and transmitted by block 504. If either of these two discrete requirements are not met, a discrete "false" signal is generated and transmitted by block 504. Alternatively, discrete logic inputs that indicate that generator 102 is being removed from service that include, but are not limited to, excitation system 112 removed from service, may be used instead of, or in addition to, the two voltage requirements. Also, alternatively, any values of generator line-to-neutral voltage are used.

Flow chart 500 further includes a discrete "end" functional logic block 506 that is coupled in electronic data communication with logic block 504. If either one of the two discrete conditions that include the generator line-to-neutral voltage being less than 95% of rated generator line-to-neutral voltage and dV/dt being negative and/or greater than a predetermined negative value is not met, a discrete "false" signal (not shown) is transmitted to logic block 506 and operation of the associated features illustrated in flow chart 500 are terminated via logic block 506 for a predetermined period of time and/or until both discrete conditions are met. The technical effect is for system 150 to not perform PD measurements and analyses for a predetermined period of time and/or until both discrete conditions are met, that is, to shift to a "standby" status while generator 102 is not being removed from service.

Flow chart 500 also includes a PDEV determination function block 508 that is coupled in electronic data communication with second discrete functional logic block 504. If both of the two discrete conditions that include the generator line-to-neutral voltage being less than 95% of rated generator line-to-neutral voltage and dV/dt being negative and/or greater than a predetermined negative value are met, a discrete "true" signal (not shown) is transmitted to function block 508. Function block 508 is programmed to receive data transmitted from sensors 201 via conduit 152 as well as data transmitted from sensors 202 via DAS 160 and conduit 162. All data received and determined by function block 508 is time stamped.

Moreover, function block 508 includes at least one algorithm programmed to determine a PDEV associated with a partial discharge level quantity ($Q_{PD}$), wherein $Q_{PD}$ is generated via a combination of measurements and determinations associated with partial discharge activity. A variety of statistical analyses are available for evaluating measured partial discharge data and a finite number of such analyses are selected for the exemplary partial discharge data. For example, a normalized quantity number (NQN), wherein the NQN (in units of millivolts (mV)) is generated via a combination of measurements and determinations associated with partial discharge activity. Another such analysis includes, but is not limited to, determinations of values for maximum partial discharge charge ($Q_{max}$) in units of mV, wherein $Q_{max}$ is defined as the pulse magnitude equivalent to 10 pulses per second (pps). Alternatively, any parameter and any statistical analysis that facilitates operation of system 100 as described herein is used. Therefore, depending on the analysis selected, $Q_{PD}$ may have any units that facilitate operation of system 100 as described herein, including, but not limited to, milliamperes (mA), picoCoulombs (pC) and mV.

Figure 6:
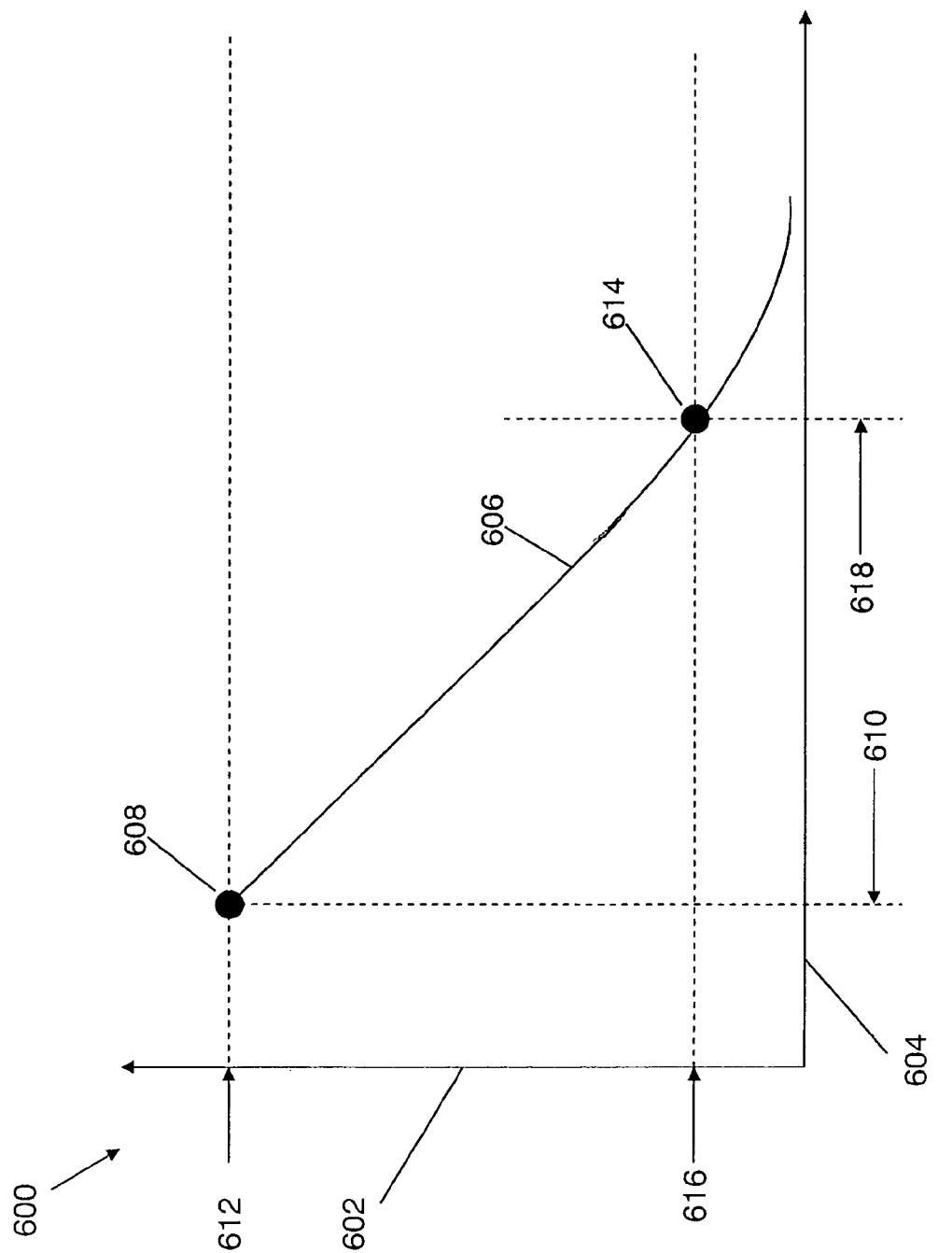
FIG. 6 is a graph of a partial discharge level vs. a generator line-to-neutral voltage generated by using the method shown in FIG. 6.

FIG. 6 is a graph 600 of a partial discharge ($Q_{PD}$) level vs. a generator line-to-neutral voltage using the method illustrated in flow chart 500 (shown in FIG. 5). Specifically, graph 600 represents at least a portion of PD data taken during a shutdown of generator 102 (shown in FIG. 1) as a function of generator line-to-neutral voltage. Graph 600 includes an ordinate (y-axis) 602 substantially representative of $Q_{PD}$ in predetermined units and an abscissa (x-axis) 604 substantially representative of generator line-to-neutral voltage graduated in units of $V_{RMS}$. A plurality of $Q_{PD}$ data points measured during a shutdown of generator 102 are plotted on graph 600 wherein a "best fit" $Q_{PD}$ versus voltage trace 606 is generated. In the exemplary embodiment, trace 606 is a substantially continuous trace of a predetermined number of data points having a predetermined spacing between such data points, wherein such spacing is substantially dependent upon features that include, but are not limited to, a scan rate of system 150 or any associated data system.

Graph 600 also includes a generator line-to-neutral voltage point 608 that is substantially defined by generator line-to-neutral voltage 610. A $Q_{PD\,Line}$ value 612 may be determined from point 608. Graph 600 further includes a PDEV point 614 that substantially defines the generator line-to-neutral voltage wherein the partial discharge activity decreases to a level that corresponds to a level just above known statistical noise levels. Specifically, point 614 is at least partially defined by a final $Q_{PD}$ value, or $Q_{PDF}$ 616 that is programmed within processor 200. Therefore, point 614 identifies a particular measured generator line-to-neutral voltage, or PDEV 618, that corresponds to the portion of trace 606 that decreases below predetermined $Q_{PDF}$ 616. Alternative embodiments of function block 508 include programming to determine and graph partial discharge activity as a function of any parameter including, but not limited to, stator winding temperature.

Referring again to FIG. 5, flow chart also includes a data storage function block 510 that is coupled in electronic data communication with PDEV determination function block 508. Function block 510 is programmed to receive data transmitted from sensors 201 via conduit 152, data transmitted from sensors 202 via DAS 160 and conduit 162, as well as graph 600 data (including measured PDEV) from function block 508. Moreover, function block 510 is programmed to transmit and store such data in data storage module 204 (shown in FIG. 2).

Flow chart 500 further includes a third discrete functional logic block 512 that is coupled in electronic data communication with data storage function block 510. In the exemplary embodiment, functional logic block 512 is programmed with at least one divisor algorithm (not shown) that divides a signal substantially representative of PDEV 512 by a signal substantially representative of $V_{Line}$ 516 (both shown in FIG. 6) and generate an analog dividend signal (not shown). Also, in the exemplary embodiment, functional logic block 512 includes at least one comparative algorithm that is programmed to discretely compare the analog dividend signal with a predetermined value, wherein a higher value for the dividend generally indicates a healthier insulation system.

Specifically, functional logic block 512 is programmed to make a determination if the most recent partial discharge extinction voltage is below a predetermined fraction of rated line-to-neutral voltage. In general, higher values of PDEV indicate a more robust condition associated with system 100 with respect to partial discharge mitigation. In contrast, lower values of PDEV indicate potential deterioration of system 100 with respect to partial discharge mitigation. Therefore, in the exemplary embodiment, a PDEV/generator line-to-neutral voltage ratio value is programmed within functional logic block 512. Alternatively, any PDEV/generator line-to-neutral voltage ratio value that facilitates operation of system 150 as described herein is used.

Functional logic block 512 is further programmed to generate and transmit a discrete "true" signal (not shown) to a low PDEV notification function block 514 that is coupled in electronic data communication with functional logic block 512 in the event that the most recent PDEV/generator line-to-neutral voltage ratio value is below a predetermined threshold value. Notification function block 514 is programmed to transmit an operator notification signal (not shown) to output device 206 (shown in FIG. 2). Such notification may be facilitated by methods that include, but are not limited to, initiating pop-up alarms on operator consoles, energizing audible control room alarms, and energizing annunciator windows.

Moreover, functional logic block 512 is programmed to generate and transmit a discrete "false" signal (not shown) to a fourth discrete functional logic block 516 coupled in electronic data communication with functional logic block 512 in the event that the most recent PDEV/generator line-to-neutral voltage ratio value is above a predetermined threshold value. In the exemplary embodiment, functional logic block 516 is programmed to make a determination if the most recently determined value of PDEV is less than half of any PDEV value determined within the previous 365 days. Alternatively, any determined value or measured parameter is compared to historical data of any vintage that facilitates operation of system 150 as described herein.

In the event that the most recent PDEV value has not changed by the predetermined value in the predetermined time frame, functional logic block 516 is configured to generate and transmit a discrete "false" signal (not shown) to a discrete "end" functional logic block 518 that is coupled in electronic data communication with logic block 516. Logic block 518 is substantially similar to logic block 506.

Functional logic block 516 is further programmed to generate and transmit a discrete "true" signal (not shown) to a PDEV trend notification function block 520 that is coupled in electronic data communication with functional logic block 516 in the event that the most recent PDEV value has changed by at least the predetermined value in the predetermined time frame. Notification function block 520 is programmed to transmit an operator notification signal (not shown) to output device 206 (shown in FIG. 2). Such notification may be facilitated by methods that include, but are not limited to, initiating pop-up alarms on operator consoles, energizing audible control room alarms, and energizing annunciator windows.

The following describes a typical sequence of determining and recording PDIV and PDEV for each phase of windings (not shown) within stator 108 (shown in FIG. 1). During startup, partial discharge monitoring system 150 (shown in FIG. 1) detects an increase in line-to-neutral voltage of generator 102 (shown in FIG. 1) and initiates a partial discharge acquisition sequence at a "fast rate", that is, between 1 to 5 readings per second for each phase. As the generator line-to-neutral voltage increases and approaches rated voltage, system 150 continues acquiring data at the same rate. PDIV is determined using the methods described above. When the generator line-to-neutral voltage has substantially stabilized and generator 102 has reached a substantially steady state condition, system 150 switches to a much lower data acquisition rate that includes a range of 1 reading per minute to 1 reading per week. The preferred data acquisition rate is approximately 4 readings per hour for each phase of generator 102. The lower acquisition rate is maintained as long as generator 102 is operating. Alternatively, any startup data acquisition rates and durations that facilitate operation of system 150 are used.

When a shutdown of generator 102 is initiated, system 150 detects a pronounced decrease in generator line-to-neutral voltage. This condition initiates a similar data acquisition sequence to determine PDEV. During shutdown, partial discharge monitoring system 150 initiates a partial discharge acquisition sequence at a fast rate between 1 to 5 readings per second for each phase. As the generator line-to-neutral voltage decreases and approaches zero volts, system 150 continues acquiring data at the same rate. When the generator line-to-neutral voltage has stabilized at approximately 0 volts, system 150 interrupts the partial discharge data acquisition sequence. PDEV is determined using the methods described above. Alternatively, any shutdown data acquisition rates and durations that facilitate operation of system 150 are used.

Exemplary embodiments of partial discharge detection systems as associated with electrical systems are described above in detail. The methods, apparatus and systems are not limited to the specific embodiments described herein nor to the specific illustrated partial discharge detection systems and electrical systems. While the invention has been described in terms of various specific embodiments, those skilled in the art will recognize that the invention can be practiced with modification within the spirit and scope of the claims.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of detecting partial discharge associated with at least a portion of an electrical system, wherein the electrical system includes at least one electrical machine electrically coupled within the electrical system, said method comprising:
    generating an electromagnetic field within an electrical machine;
    collecting partial discharge data from at least a portion of an electrical system;
    determining a first partial discharge inception voltage (PDIV) value of at least a portion of partial discharge activity within the electrical system;
    determining a ratio of the first PDIV value to a predetermined line-neutral voltage of the at least one electrical machine;
    generating at least one trending comparison of the first PDIV value and at least one second PDIV value of at least a portion of partial discharge activity within the electrical system; and
    outputting the ratio and trending comparison to indicate the condition of the partial discharge activity within the electrical system.

2. A method in accordance with claim 1 wherein generating an electromagnetic field within an electrical machine comprises:
    increasing a speed of a rotational element of the electrical machine to substantially a synchronous speed; and
    energizing a field excitation device that is electrically coupled to the rotational element.

3. A method in accordance with claim 1 wherein collecting partial discharge data from at least a portion of an electrical system comprises automatically initiating partial discharge data collection upon at least one of:
    a measured voltage of the electrical machine exceeding a predetermined voltage threshold value; and
    the measured voltage of the electrical machine increasing as a function of time.

4. A method in accordance with claim 1 wherein determining a PDIV value comprises recording a measured electrical machine voltage value when one of a measured maximum partial discharge charge ($Q_{max}$) value and a calculated normalized quantity number (NQN) value exceeds a predetermined threshold value.

5. A method in accordance with claim 1 wherein generating at least one trending comparison of the first PDIV value and at least one second PDIV value comprises at least one of:
    creating PDIV value baseline data for at least a portion of the electrical system;
    generating a PDIV value trending pattern for at least a portion of the electrical system; and
    generating at least one PDIV value operator notification for at least a portion of the electrical system.

6. A method in accordance with claim 5 wherein generating at least one PDIV value operator notification for at least a portion of the electrical system comprises at least one of:

determining a difference between the first PDIV value and the second PDIV value; and determining a percentage change between the first PDIV value and the second PDIV value.

7. A method in accordance with claim 1 further comprising:

at least partially collapsing the electromagnetic field within the electrical machine;

determining a first partial discharge extinction voltage (PDEV) value;

generating a comparison of the first PDEV value and a second PDEV value; and outputting the results.

8. A partial discharge detection system comprising:

at least one output device; and at least one processor coupled in electronic data communication with said at least one output device, wherein said at least one processor is programmed with a first algorithm configured to automatically determine a first partial discharge inception voltage (PDIV) value of at least a portion of partial discharge activity within an electrical system automatically upon at least one of:

a measured voltage of at least one electrical machine exceeding a predetermined voltage threshold value, wherein the electrical system includes the electrical machine electrically coupled within the electrical system; and the measured voltage of the at least one electrical machine increasing as a function of time, wherein said at least one processor is programmed to determine a ratio of the first PDIV value to a predetermined line-neutral voltage of the at least one electrical machine.

9. A partial discharge detection system in accordance with claim 8 wherein said at least one processor is further programmed with a second algorithm configured to generate at least one trending comparison between the first PDIV value of at least a portion of partial discharge activity within the electrical system and at least one second PDIV value of at least a portion of partial discharge activity within the electrical system.

10. A partial discharge detection system in accordance with claim 9 wherein the at least one trending comparison between the first PDIV value of at least a portion of partial discharge activity within the electrical system and at least one second PDIV value of at least a portion of partial discharge activity within the electrical system includes:

a calculated difference between the first PDIV value and the at least one second PDIV value; and a calculated percentage change between the first PDIV value and the at least one second PDIV value.

11. A partial discharge detection system in accordance with claim 10 wherein said at least one processor is further programmed with a third algorithm configured to generate at least one of:

a plurality of PDIV value baseline data;

at least one PDIV value trending pattern; and at least one PDIV value operator notification.

12. A partial discharge detection system in accordance with claim 11 wherein said at least one processor is further programmed with a fourth algorithm configured to automatically determine a first partial discharge extinction voltage (PDEV) value of at least a portion of partial discharge activity within the electrical system automatically upon at least one of:

a measured voltage of the electrical machine decreasing below a predetermined voltage threshold value; and the measured voltage of the electrical machine decreasing as a function of time.

13. A partial discharge detection system in accordance with claim 12 wherein said at least one processor is further programmed with a fifth algorithm configured to generate at least one trending comparison between the first PDEV value of at least a portion of partial discharge activity within the electrical system and at least one second PDEV value of at least a portion of partial discharge activity within the electrical system.

14. A partial discharge analyzer system in accordance with claim 13 wherein the at least one trending comparison between the first PDEV value of at least a portion of partial discharge activity within the electrical system and at least one second PDEV value of at least a portion of partial discharge activity within the electrical system includes:

a calculated difference between the first PDEV value and the at least one second PDEV value; and a calculated percentage change between the first PDEV value and the at least one second PDEV value.

15. A partial discharge detection system in accordance with claim 14 wherein said at least one processor is further programmed with a sixth algorithm configured to generate at least one of a plurality of PDEV value baseline data;

at least one PDEV value trending pattern; and at least one PDEV value operator notification.

16. An electrical system comprising:

at least one electrical device electrically coupled within said electrical system;

at least one measurement device coupled to said at least one electrical device; and a partial discharge detection system coupled to at least a portion of said electrical system comprising:

at least one output device; and at least one processor coupled in electronic data communication with said at least one output device and said at least one measurement device, wherein said at least one processor is programmed with a first algorithm configured to automatically determine a first partial discharge inception voltage (PDIV) value of at least a portion of partial discharge activity within said electrical system automatically upon at least one of:

a measured voltage of said at least one electrical device exceeding a predetermined voltage threshold value; and the measured voltage of said at least one electrical device increasing as a function of time, wherein said at least one processor is programmed to determine a ratio of the first PDIV value to a predetermined line-neutral voltage of said at least one electrical device.

17. An electrical system in accordance with claim 16 wherein said at least one processor is further programmed with a second algorithm configured to generate at least one trending comparison between the first PDIV value of at least a portion of partial discharge activity within said electrical system and at least one second PDIV value of at least a portion of partial discharge activity within said electrical system.

18. An electrical system in accordance with claim 17 wherein the at least one trending comparison between the first PDIV value of at least a portion of partial discharge activity within said electrical system and at least one second PDIV value of at least a portion of partial discharge activity within said electrical system includes:

a calculated difference between the first PDIV value and the at least one second PDIV value; and a calculated percentage change between the first PDIV value and the at least one second PDIV value.

19. An electrical system in accordance with claim 18 wherein said at least one processor is further programmed with a third algorithm configured to generate at least one of:
   a plurality of PDIV value baseline data;
   at least one PDIV value trending pattern; and
   at least one PDIV value operator notification.

20. An electrical system in accordance with claim 16 wherein said at least one processor is further programmed with a fourth algorithm configured to automatically determine a first partial discharge extinction voltage (PDEV) value of at least a portion of partial discharge activity within said electrical system automatically upon at least one of:
   a measured voltage of said at least one electrical device decreasing below a predetermined voltage threshold value; and
   the measured voltage of said at least one electrical device decreasing as a function of time.

* * * * *